United States Patent
Kawai et al.

(10) Patent No.: US 10,064,320 B2
(45) Date of Patent: Aug. 28, 2018

(54) COMPONENT MOUNTER

(75) Inventors: Hidetoshi Kawai, Chiryu (JP); Masafumi Amano, Okazaki (JP); Katsushi Ota, Anjyo (JP); Kazuhiro Asada, Tokai (JP); Tsutomu Kunihiro, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 347 days.

(21) Appl. No.: 14/411,156

(22) PCT Filed: Jul. 2, 2012

(86) PCT No.: PCT/JP2012/066876
§ 371 (c)(1),
(2), (4) Date: Dec. 24, 2014

(87) PCT Pub. No.: WO2014/006670
PCT Pub. Date: Jan. 9, 2014

(65) Prior Publication Data
US 2015/0208561 A1    Jul. 23, 2015

(51) Int. Cl.
*H05K 13/04* (2006.01)
*B65D 88/54* (2006.01)

(52) U.S. Cl.
CPC ......... *H05K 13/0417* (2013.01); *B65D 88/54* (2013.01); *Y10T 29/53174* (2015.01)

(58) Field of Classification Search
CPC .... H05K 13/0417; B65D 88/60; B65D 88/54; B65D 88/546; Y10T 29/53174
USPC ............................ 221/250; 222/342, 251–41
See application file for complete search history.

(56) References Cited

U.S. PATENT DOCUMENTS 4,176,997 A * 12/1979 Hungerbach ........ B65G 11/066
414/299

FOREIGN PATENT DOCUMENTS

| JP | 3 215997 | 9/1991 |
| JP | 7 226599 | 8/1995 |
| JP | 2004 327898 | 11/2004 |
| JP | 2004327898 A * | 11/2004 |
| JP | 2006 93499 | 4/2006 |
| JP | 2010 140970 | 6/2010 |

OTHER PUBLICATIONS

Machine translation of JP2004327898A, obtained Oct. 1, 2016.*
Japanese Office Action dated Jun. 14, 2016 in Patent Application No. 2014-523457 (with English language translation).
Extended European Search Report dated Jun. 19, 2015 in Patent Application No. 12880714.6.

(Continued)

*Primary Examiner* — Livius R Cazan
(74) *Attorney, Agent, or Firm* — Oblon, McClelland, Maier & Neustadt, L.L.P.

(57) ABSTRACT

A component mounter which picks components which are stored in tape and supplied from a component supply device by a component picking device and mounts components on a board which is conveyed by a board conveyance device including a waste box which stores the cut tape after the components are picked, a scraping out device which can scrape the tape out of the waste box, and a control device which controls scraping out the stored tape by the scraping out device when the tape is stored in the waste box to a predetermined amount.

4 Claims, 6 Drawing Sheets

(56) References Cited

OTHER PUBLICATIONS

International Search Report dated Jul. 31, 2012 in PCT/JP12/066876 Filed Jul. 2, 2012.
Japanese Office Action dated Jan. 17, 2017 in patent application No. 2014-523457 with unedited computer generated English translation.

* cited by examiner

COMPONENT MOUNTER

TECHNICAL FIELD

The present application relates to a component mounter which picks components which are stored in tape and supplied from a component supply device by a component picking device, and mounts components on a board which is conveyed by a board conveyance device, wherein in particular the component mounter can process cut tape after components are picked.

BACKGROUND ART

For example, disclosed in patent literature 1 is a component mounter equipped with a tape collection device which is comprised from: a guiding means which guides carrier tape and cover tape to a common collection position, a cutting mechanism which cuts carrier tape and cover tape together, and a storage member which stores carrier tape and cover tape together after cutting.

CITATION LIST

Patent Literature

Patent Literature 1: Japanese Unexamined Patent Application Publication Number JP7-226599

SUMMARY

In recent years, with the increase in speed of component mounters, carrier tape and cover tape after cutting tends to be generated in large volumes in a short time. For the component mounter disclosed in patent literature 1, an operator has to frequently move storage members between multiple component mounters which make up manufacturing lines, which is very time consuming work.

The present disclosure describes an item that takes the above issue into account, and the object is to provide a component mounter which can simplify the processing of cut tape after components are picked.

Means for Solving the Problem

In order to solve the above problem, a component mounter is provided which picks components which are stored in tape and supplied from a component supply device by a component picking device and mounts components on a board which is conveyed by a board conveyance device comprising: a waste box which stores the cut tape after the components are picked, a scraping out device which can scrape the tape out of the waste box, and a control device which controls scraping out the stored tape by the scraping out device when the tape is stored in the waste box to a predetermined amount.

The scraping out device is provided so that it can move in the waste box and comprises a scraper which can scrape the tape stored in the waste box out of the waste box and a moving device which moves the scraper.

The component mounter can face a collection device which collects the tape which is scraped out from the scraping out device.

Multiple component mounters are arranged in a line, and the collection device is equipped with a moving device which can move between each of the component mounters.

An ejection door which can be opened and closed is provided on the scraping out device, the collection device is provided with collection doors located so that they can face the ejection door which can be opened and closed, and the control device collects the tape which is scraped out of the scraping out device into the collection device by opening the ejection door by the pushing force of the tape scraped out of the scraping out device and by opening the collection doors by the pushing force of the ejection door which is opened.

Effects

Even if a large amount of the tape after cutting is generated in a short time, because the tape can be temporarily stored in a waste box, the processing frequency of the tape can be reduced. Further, when the amount of tape stored in a waste box reaches a predetermined amount, because the tape can be automatically scraped out of the waste box, the processing efficiency of the tape can be improved.

Because empty space can be created by moving tape accumulated to a predetermined amount in the waste box to a side of the waste box by a scraper, it is possible to efficiently store the tape after cutting in the waste box and the processing frequency of the tape can be reduced further.

Because tape which has been automatically scraped out of a waste box can be automatically collected in a collection device, time consuming work of collecting tape by an operator can be omitted.

Because a collection device can be automatically moved between multiple component mounters which make up a manufacturing line, the efficiency of collecting tape can be improved.

Because an ejection door of a waste box and collection doors of a collection device are opened in conjunction with the movement in which tape is scraped out of a waste box, a device or the like to open and close each door is not required and this can reduce the device cost.

BRIEF DESCRIPTION OF DRAWINGS

FIG. 3A is a diagram showing the state after tape is inserted, FIG. 3B is a diagram showing the state immediately before tape is cut, FIG. 3C is a diagram showing the state while tape is being cut, and FIG. 3D is a diagram showing the state after tape is cut.

FIG. 4A is a diagram showing the state before tape is moved, FIG. 4B is a diagram showing the state after tape is moved, and FIG. 4C is a diagram showing the state after space has been created.

FIG. 5A is a diagram showing the state before collecting tape and FIG. 5B is a diagram showing the state while moving tape to collect tape.

FIG. 6A is a diagram showing the state immediately before tape is collected and FIG. 6B is a diagram showing the state after tape is collected.

DESCRIPTION OF EMBODIMENTS

Figure 1:
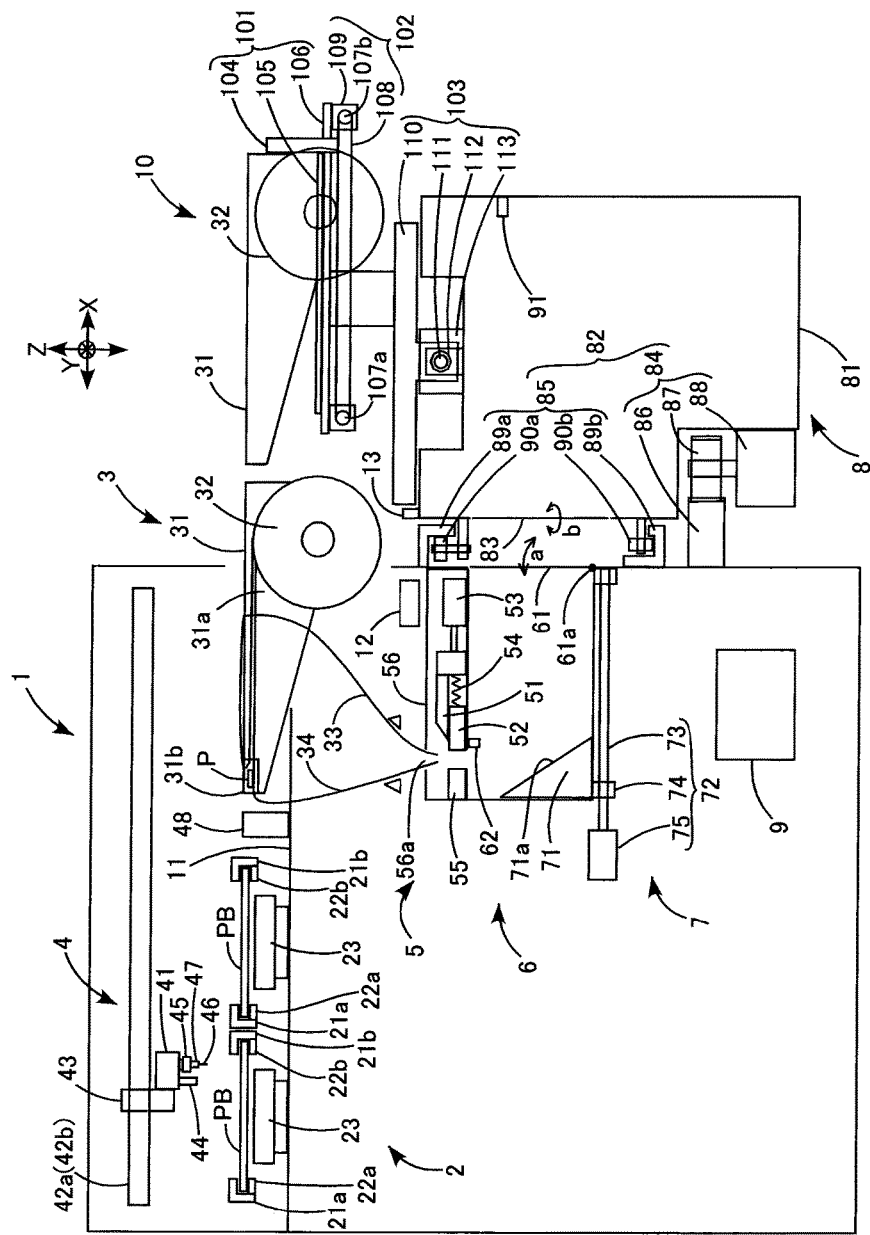
FIG. 1 is a cross section showing a schematic outline of the component mounter of an embodiment of the present disclosure.

The following describes an embodiment of the component mounter of the present disclosure based on the figures. In FIG. 1, the conveyance direction of board PB is the Y direction (the vertical direction on the page), the horizontal direction perpendicular to the Y direction is the X direction, and the vertical direction perpendicular to the Y direction is Z direction.

As shown in FIG. 1, component mounter 1 according to this embodiment comprises items such as: board conveyance device 2 which is provided at the rear side of the upper surface of base 11 (left side in FIG. 1.) and which conveys and loads/unloads boards PB to/from a component mounting position; component supply device 3 which is provided at the front side of the upper surface of base 11 (right side in FIG. 1) and which supplies components P which are mounted on board PB; and component picking device 4 which is provided at the upper side of base 11 and which picks and transports components which are placed on board PB.

Further, component mounter 1 comprises items such as: tape cutting device 5 which is provided under component supply device 3 and which cuts tapes 33 and 34 in which the component P to be described later is stored after component P is picked up; waste box 6 which is provided under tape cutting device 5 and which stores the cut tapes 33 and 34; tape scraping out device 7 which is provided on waste box 6 and which scrapes the stored tapes 33 and 34 out of waste box 6; tape collection device 8 which can be placed facing tape scraping out device 7 and which collects the tapes 33 and 34 to be scraped out; and control device 9 which controls the movements of board conveyance device 2, component supply device 3, component picking device 4, tape cutting device 5, and tape scraping out device 7.

Board conveyance device 2 comprises items such as a pair of guide rails 21a and 21b, a pair of conveyor belts 22a and 22b, and clamp device 23. A pair of guide rails 21a and 21b extend in the Y direction and are arranged in parallel at a distance approximately the same as the width of board PB. A pair of conveyor belts 22a and 22b are lined up in parallel directly under guide rails 21a and 21b. Clamp device 23 is provided between the pair of guide rails 21a and 21b and under the mounting position.

With board conveyance device 2 having such a configuration, board PB is conveyed to the component mounting position in the Y direction by pair of conveyor belts 22a and 22b while being guided by pair of guide rails 21a and 21b, and is clamped, positioned, and fixed by being pushed up from conveyor belts 22a and 22b by clamp device 23.

In component supply device 3, multiple cassette type feeders 31 which each store and supply different types of components P are set along the Y direction. Feeder 31 is composed mostly of feeder main body 31a to which component supply reel 32 is set at the rear and component take up position 31b provided at the front section of the feeder main body 31a. In component supply reel 32, carrier tape 34 which is covered with cover tape 33 in which components P are arranged at a predetermined pitch is wound around.

With component supply device 3 having such a configuration, carrier tape 34 is pulled out at a predetermined pitch by a sprocket (omitted from figure) which is equipped on feeder main body 31a, cover tape 33 is peeled off, and components P are sequentially indexed to component take up position 31b. Further, after components P are picked, cover tape 33 and carrier tape 34 are indexed to tape cutting device 5.

Component picking device 4 is equipped with items such as head holder 41 which is moved within a horizontal plane by moving device 40. Moving device 40 is equipped with items such as a pair of fixed rails 42a and 42b, and head moving rail 43. A pair of fixed rails 42a and 42b extend in the X direction and are arranged parallel to each other above both ends of board conveyance device 2. Head moving rail 43 is arranged extending in the Y direction and both ends are movably supported along fixed rails 42a and 42b. Head moving rail 43 is configured such that movement can be controlled by a servo motor via a ball screw (both are omitted from figure).

Head holder 41 is movably supported along head moving rail 43. Head holder 41 is comprised such that movement can be controlled by a servo motor via a ball screw (both are omitted from figure). Recognition camera 44 which can recognize the component mounting position on board PB and mounting head 45 which can be rotated around the Z axis and raised/lowered in the Z direction are held on head holder 41. With this mounting head 45, nozzle holder 47 which detachably holds component suction nozzle 46 which picks up component P is provided in a protruding manner under and at the rotating center of mounting head 45.

Nozzle holder 47, to which component suction nozzle 46 is attached, is supported such that it can be raised/lowered in the Z direction from mounting head 45 and can be rotated around the Z axis. Nozzle holder 47, to which component suction nozzle 46 is attached, is configured such that it is controllably raised/lowered by a servo motor via a ball screw (both are omitted from figure) and controllably rotated by a servo motor via a gear mechanism (both are omitted from figure). Component suction nozzle 46 is formed in an approximately hollow cylindrical shape, connected to a vacuum pump (omitted from figure) via a three-way valve which can switch between atmospheric pressure, positive pressure, and negative pressure, and is configured such that component P can be picked up and held at the lower side of the nozzle. Also, between component picking device 4 and component supply device 3, component recognition camera 48 which can recognize the pickup condition of component P on component suction nozzle 46 is attached.

With component picking device 4 having such a configuration, component P supplied at component take up position 31b of feeder 31 is picked up by component suction nozzle 46, transported to board PB which is positioned at the component mounting position by head moving rail 43 and head holder 41, and mounted at the component mounting position on board PB by component suction nozzle 46.

Tape cutting device 5 comprises items such as: cutter 51 which is arranged such that the blade edge faces the X direction; pressing member 52 which is provided adjacent to and below cutter 51; air cylinder 53 which moves cutter 51 in the X direction; pressing spring 54 which is arranged such that the axis line direction faces the X direction and one end is attached to pressing member 52 and the other end is attached to cutter 51; and pressing receiving member 55 which is arranged facing pressing member 52 while being separated by a predetermined gap in the X direction. Cutter 51 and the like are embedded in housing 56 which is formed with inlet 56a for cover tape 33 and carrier tape 34 at the upper section.

Cutter 51 is a wide single blade cutter and is movably provided in the X direction in order to cut cover tape 33 and carrier tape 34 which are sandwiched between pressing member 52 and pressing receiving member 55 to a predetermined length. Pressing member 52 is a plate member with a width slightly wider than the width of cutter 51 and is movably provided in the X direction in order to press and sandwich cover tape 33 and carrier tape 34 with pressing receiving member 55.

Pressing spring 54 is a compression spring and is provided such that it can press cover tape 33 and carrier tape 34 which are sandwiched by pressing receiving member 55 and pressing member 52 with the movement of cutter 51.

With tape cutting device 5 having such a configuration, cover tape 33 and carrier tape 34 indexed between pressing member 52 and pressing receiving member 55 are sandwiched by pressing member 52 and pressing receiving member 55 by the movement of air cylinder 53 and each is cut with cutter 51. Then, cover tape 33 and carrier tape 34 which are cut are released from being sandwiched by pressing member 52 and pressing receiving member 55 by the movement of air cylinder 53, and then stored in waste box 6.

Waste box 6 is formed in a hollow cuboid shape and configured such that cover tape 33 and carrier tape 34 which have been cut with tape cutting device 5 can be stored. On the front side of this waste box 6 (right surface in FIG. 1), ejection door 61 which can be opened and closed in the "a" direction shown in the figure around the Y axis by hinge 61a provided at the lower section is provided. An extension spring which is omitted from the figure is attached in the closing direction on this ejection door 61. Also, storage sensor 62 which detects that cover tape 33 and carrier tape 34 which have been accumulated and cut are accumulated directly under the tape cutting position to a predetermined amount or more is attached in the inner upper section of waste box 6.

Tape scraping out device 7 comprises items such as: scraper 71 which is movably provided in the X direction within waste box 6 and which can scrape cover tape 33 and carrier tape 34 stored in waste box 6 out of waste box 6; and scraper moving device 72 comprising ball screw 73, nut 74, and servo motor 75 which move this scraper 71.

Slope 71a for scraping out cover tape 33 and carrier tape 34 stored in waste box 6 is formed, and nut 74 engaged with ball screw 73 is fixed, on scraper 71.

With waste box 6 and tape scraping out device 7 having such a configuration, cover tape 33 and carrier tape 34 stored in waste box 6 are pushed by scraper 71 which moves by the rotation of ball screw 73 rotated by the movement of servo motor 75, and by that pushing force, ejection door 61 is opened and tape is scraped out of waste box 6.

Tape collection device 8 comprises items such as: collection box 81 which can move between multiple component mounters 1 arranged in the Y direction which make up a component mounting line; collection box moving device 82 which moves this collection box 81; feeder supply device 10 which is arranged on the upper surface of collection box 81 and which can supply feeder 30 or the like to component supply device 3; and contactless head 13 which supplies power or communicates and so on with contactless unit 12 equipped with component mounter 1 in a contactless manner.

Collection box 81 is formed in a hollow cuboid shape and is configured such that cover tape 33 and carrier tape 34 which are scraped out of waste box 6 can be collected. Collection doors 83 which can be opened and closed with a double-opening from the center in the "b" direction shown in the figure around the Z axis by hinges provided at the right and left which are omitted from the figure are provided on the front surface of this collection box 81 (left surface in FIG. 1). An extension spring which is omitted from the figure is attached to these collection doors 83 in the closing direction. Also, in the inner upper side section of collection box 81, collection sensor 91 which detects that the collection amount of cover tape 33 and carrier tape 34 reaches full capacity is attached.

Collection box moving device 82 is equipped with moving mechanism 84 and guide mechanism 85 and so on. Moving mechanism 84 is equipped with rack 86, pinion 87 which can engage with this rack 86, servo motor 88 which rotates this pinion 87 and so on. Rack 86 is fixed at the lower front surface (right surface in FIG. 1) of component mounter 1 such that the teeth of rack 86 extend in the Y direction facing forward. Pinion 87 is engaged with the shaft of servo motor 88 and fixedly arranged at the lower front surface (left surface in FIG. 1) of collection box 81 to be engaged with rack 86. In addition, as moving mechanism 84, a linear motor is acceptable.

Guide mechanism 85 is equipped with two guide rails 89a and 89b and two pairs of guide rollers 90a and 90b which can respectively engage with and rotate with respect to two guide rails 89a and 89b and so on. Two guide rails 89a and 89b are respectively fixed extending in the Y direction above and below ejection door 61 on the front surface (right surface in FIG. 1) of waste box 6 of component mounter 1. A pair of guide rollers 90a is fixedly arranged at the front surface (left surface in FIG. 1) of collection box 81 separated by a predetermined gap in the Y direction to engage with the upper guide rail 89a. A pair of guide rollers 90b is fixedly arranged at the front surface (left surface in FIG. 1) of collection box 81 separated by a predetermined gap in the Y direction to engage with the lower guide rail 89b.

With tape collection device 8 having such a configuration, collection box 81 is positioned in front of the waste box of a specific component mounter 1 along guide rails 89a and 89b by the movement of servo motor 88. And, a predetermined amount of cover tape 33 and carrier tape 34 stored inside waste box 6 are collected inside collection box 81 by collection doors 83 being opened by the pushing force of ejection door 61 which is opened when cover tape 33 and carrier tape 34 are scraped out.

Feeder supply device 10 comprises items such as: feeder moving device 101 which can move between collection box 81 loaded with a feeder 31 which should be supplied and component supply device 3; X-direction moving device 102 for moving feeder moving device 101 in the X direction; and Y-direction moving device 103 for moving feeder moving device 101 along with X-direction moving device 102 in the Y direction.

Feeder moving device 101 comprises items such as: support member 104 for gripping and supporting feeder 31 which should be supplied; guide rail 105 for supporting and guiding support member 104 such that it can move in the X direction; and pedestal 106 fixed such that guide rail 105 extends in the X direction.

X-direction moving device 102 comprises items such as: pair of pulleys 107a and 107b rotatably supported on the lower surface of pedestal 106 separated in the X direction; belt 108 stretched between the pair of pulleys 107a and 107b to which support member 104 is fixed; and servo motor 109 which rotates pulley 107a.

Y-direction moving device 103 comprises items such as: table 110 to which pedestal 106 is fixed; ball screw 111 rotatably supported on the upper surface of collection box 81 extending in the Y direction; nut 112 fixed to table 110 which can engage with ball screw 111; and servo motor 113 which rotates ball screw 111.

With feeder supply device 10 having such a configuration, feeder 31 which should be supplied is moved by the movement of servo motor 113 in the Y direction and positioned at the feeder position of component supply device 3 which requires supply. And, feeder 31 is moved in the X direction along guide rail 105 by the movement of servo motor 109, and loaded and set at the feeder position which requires supply. Also, feeder 31 for which component supply is completed is held by support member 104 and pulled out on to pedestal 106.

Contactless head 13 is provided on the upper surface of collection box 81 and configured such that it can supply power to drive contactless unit 12 and servo motors 109 and 113 and so on equipped on component mounter 1 and can perform data communications and so on for the ID and the like of feeder 31 in a contactless manner. In addition, it is also acceptable for feeder supply device 10 to be equipped with a rechargeable battery to drive servo motors 109 and 113 and so on.

Figure 2:
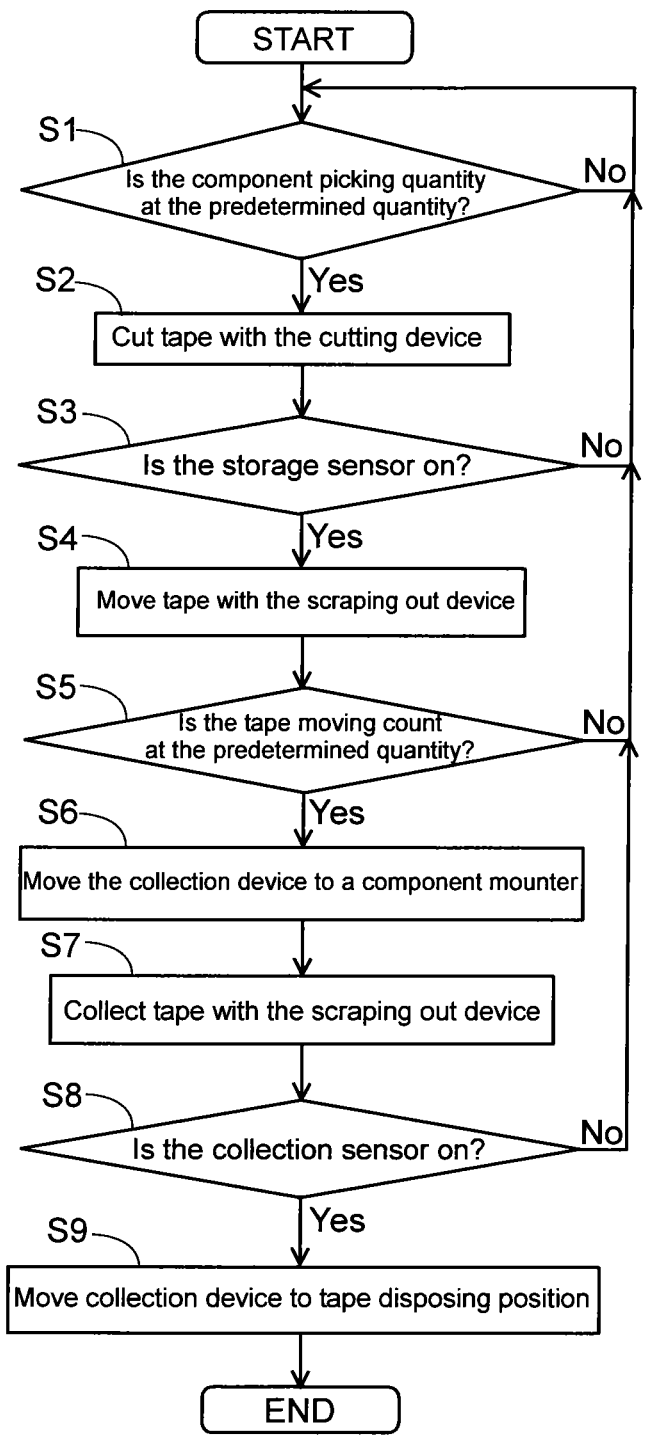
FIG. 2 is a flow chart to illustrate tape processing operation for the component mounter from FIG. 1.

Next, the flow chart in FIG. 2 and operation diagrams from FIG. 3. to FIG. 6. are referenced to describe the operation of component mounter 1. Further, descriptions of component mounting actions are omitted because they are conventional operations and descriptions about tape processing operation are given. Here, each tip of cover tape 33 and carrier tape 34 is assumed to have been indexed into inlet 56a formed at housing 56 of tape cutting device 5.

Control device 9 reads the component picking quantity by component suction nozzle 46 after components are started to be mounted and judges whether the component picking quantity has reached a predetermined quantity and cover tape 33 and carrier tape 34 have been indexed in housing 56 of tape cutting device 5 to a predetermined length (step S1). If it is judged that the component picking quantity has reached a predetermined quantity and cover tape 33 and carrier tape 34 have been indexed in housing 56 of tape cutting device 5 to a predetermined length (refer to FIG. 3A), tape cutting device 5 is operated to cut cover tape 33 and carrier tape 34 to a predetermined length (step S2).

Figure 3A:
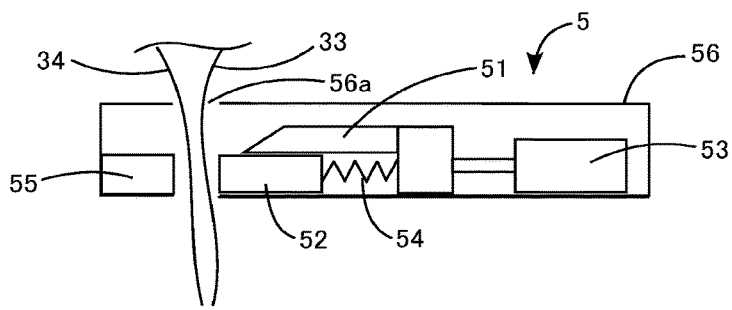
FIGS. 3A-3D are operation diagrams of a tape cutting device of the component mounter from FIG. 1.
Figure 3B:
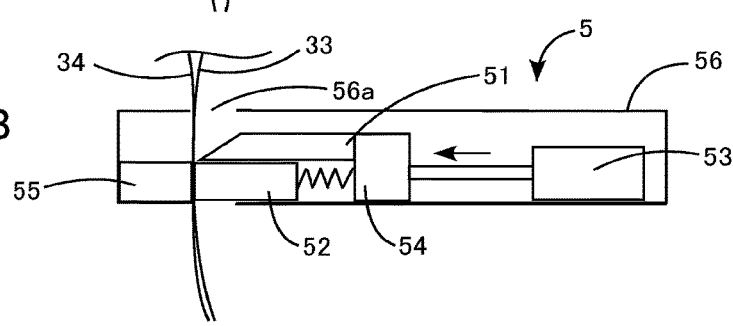
Figure 3C:
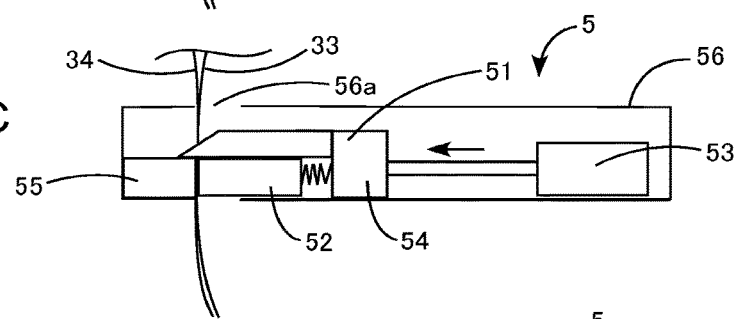
Figure 3D:
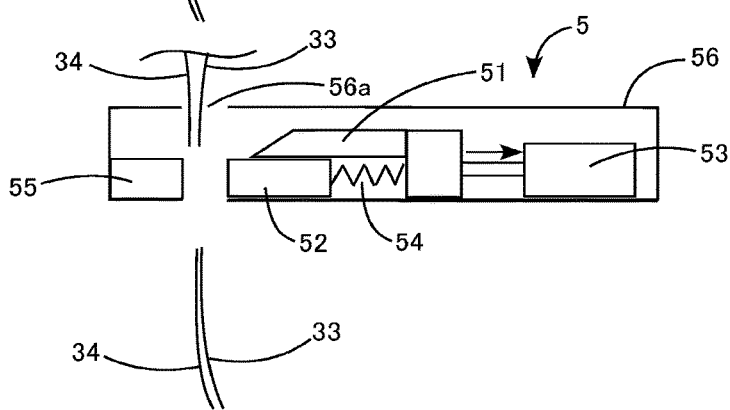

Specifically, first the air is supplied to air cylinder 53, and cover tape 33 and carrier tape 34 are sandwiched by pressing member 52 and pressing receiving member 55 (refer to FIG. 3B). Further, air is supplied to air cylinder 53 and the upper section of the pressed cover tape 33 and carrier tape 34 are cut with cutter 51 respectively (refer to FIG. 3C). Then, air is released from air cylinder 53 to release cover tape 33 and carrier tape 34 which were cut from being sandwiched by pressing member 52 and pressing receiving member 55 and to store them in waste box 6 by dropping them (refer to FIG. 3D).

Control device 9 judges whether storage sensor 62 is turned on (step S3) and returns back to step S1 and performs the processing described above if storage sensor 62 is not turned on. Conversely, if control device 9 detects that storage sensor 62 is turned on and cover tape 33 and carrier tape 34 have been cut and accumulated to a predetermined amount in waste box 6 directly under the tape cutting position, it moves tape scraping out device 7 to make empty space directly under the tape cutting position (step S4).

Figure 4A:
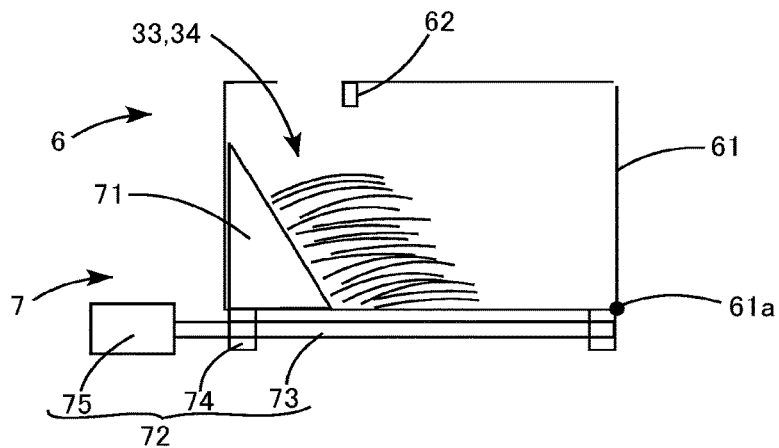
FIGS. 4A-4C are operation diagrams of a tape scraping out device when a space is created in the waste box of the component mounter from FIG. 1.
Figure 4B:
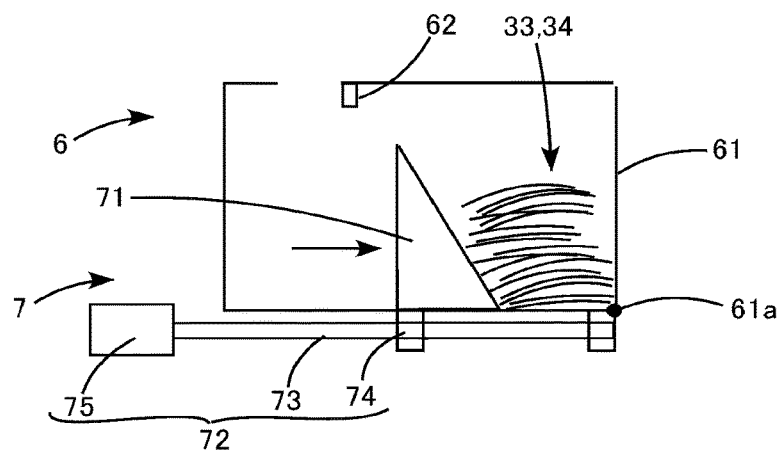
Figure 4C:
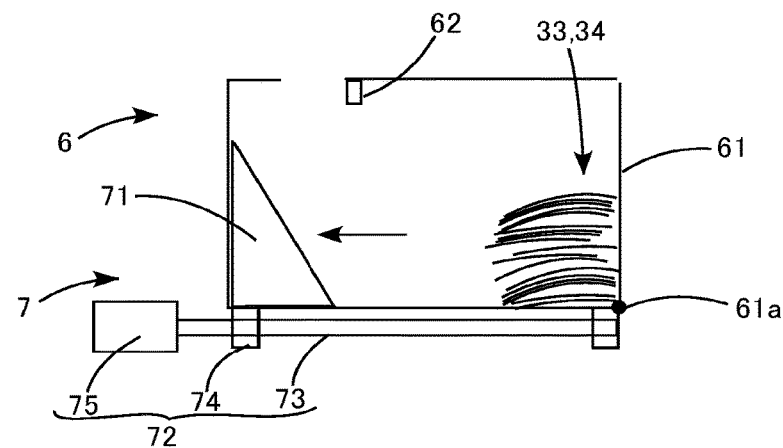

Specifically, cover tape 33 and carrier tape 34 which are cut tend to accumulate directly under the tape cutting position in waste box 6 (refer to FIG. 4A). Therefore, when a detection signal of storage sensor 62 is received, cover tape 33 and carrier tape 34 accumulated directly under the tape cutting position are moved part of the way to the ejection door 61 side in waste box 6 by scraper 71 (refer to FIG. 4B). By this, the tape storage amount can be increased by making empty space directly under the tape cutting position in waste box 6 (refer to FIG. 4C).

Figure 5A:
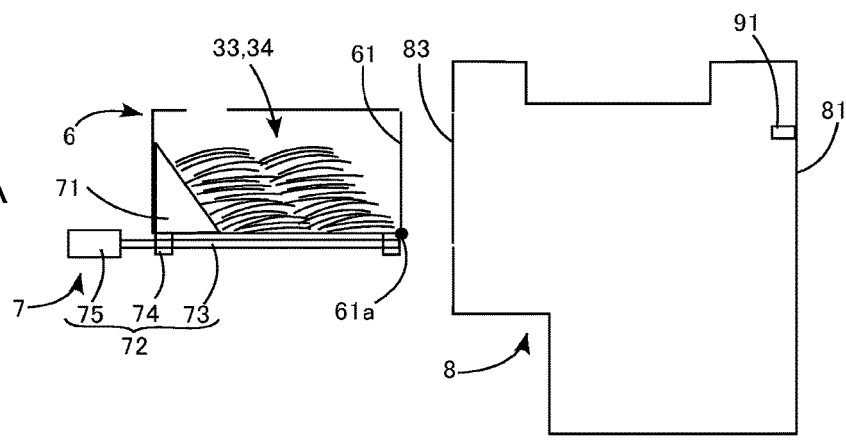
FIGS. 5A and 5B are operation diagrams of a tape scraping out device when tape is collected into the tape collection device of the component mounter from FIG. 1.

Control device 9 reads the tape movement count due to the above scraper 71, and judges whether the tape movement count has reached a predetermined quantity and waste box 6 has been filled with cover tape 33 and carrier tape 34 (step S5). If control device 9 judges that the tape moving count has reached a predetermined quantity and waste box 6 has been filled with cover tape 33 and carrier tape 34 (refer to FIG. 5A), tape collection device 8 is moved to the component mounter 1 and positioned (step S6). Then, tape scraping out device 7 is operated to scrape out cover tape 33 and carrier tape 34 to tape collection device 8 (step S7).

Figure 5B:
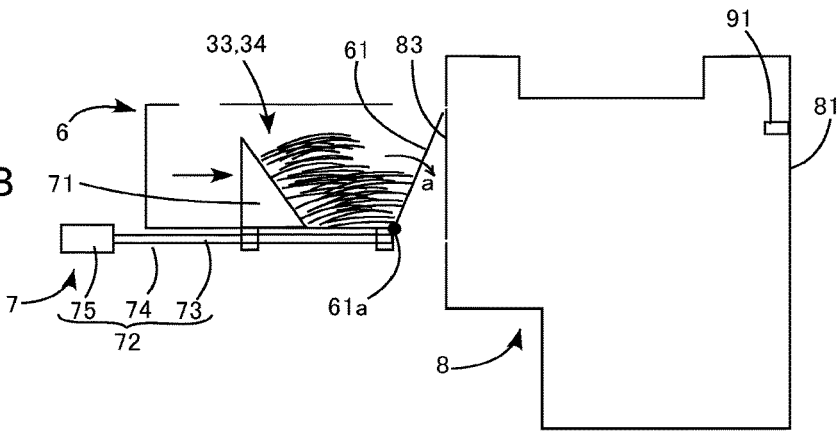

Specifically, scraper moving device 72 is driven to move scraper 71 to the ejection door 61 side in waste box 6 together with cover tape 33 and carrier tape 34, and ejection door 61 is opened by the pushing force of the tape (refer to FIG. 5B). Further, scraper moving device 72 is driven to move scraper 71 to the ejection door 61 side together with cover tape 33 and carrier tape 34, and collection doors 83 of collection box 81 are opened by the pushing force of ejection door 61 which is opened (refer to FIG. 6A). At this moment, ejection door 61 is configured such that the it can be opened and closed in the "a" direction shown in the figure around the Y axis by hinge 61a provided at the lower section, and collection doors 83 are configured such that they can be opened and closed with a double-opening from the center in the "b" direction shown in the figure around the Z axis by hinges provided at the right and left, therefore, doors can be easily opened only by the pushing force of tapes 33 and 34.

Figure 6A:
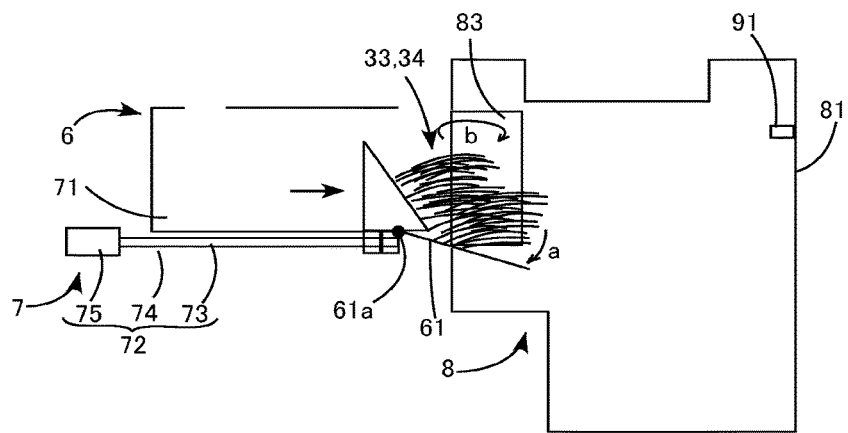
FIGS. 6A and 6B are operation diagrams of a tape scraping out device when tape is collected into the tape collection device of the component mounter from FIG. 1.
Figure 6B:
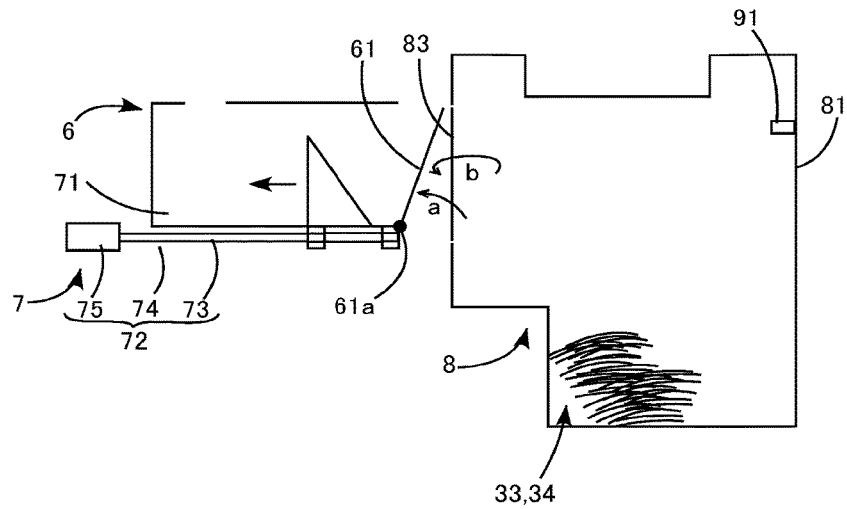

And, because the rotation shaft of ejection door 61 is provided higher than the bottom edge of collection doors 83, ejection door 61 is tilted in collection box 81 in the right and down direction in FIG. 6A. Therefore, cover tape 33 and carrier tape 34 on ejection door 61 naturally fall into collection box 81, and cover tape 33 and carrier tape 34 can be easily collected. Further, by moving scraper 71 toward the rear side of waste box 6, ejection door 61 and collection doors 83 are automatically closed by the spring force (refer to FIG. 6B).

Control device 9 judges whether collection sensor 91 is turned on (step S8) and returns back to step S1 and performs the processing described above if collection sensor 91 is not turned on. Conversely, if control device 9 detects that collection sensor 91 is turned on and cover tape 33 and carrier tape 34 which are collected have filled collection box 81, it moves tape collection device 8 to the tape disposing position (step S9) and finishes all processing. Then, an operator takes out and disposes of cover tape 33 and carrier tape 34 which are in collection box 81.

As described above, according to component mounter 1 of the embodiment, even if a large amount of the cover tape 33 and carrier tape 34 after cutting is generated in a short time, because the tapes 33 and 34 can be temporarily stored in waste box 6, the processing frequency of the tapes 33 and 34 can be reduced. Further, when the amount of tapes 33 and 34 stored in waste box 6 reaches a predetermined amount, because the tapes 33 and 34 can be automatically scraped out of waste box 6, the processing efficiency of the tapes 33 and 34 can be improved.

Also, because empty space can be created by moving tapes 33 and 34 accumulated to a predetermined amount in waste box 6 to a side of waste box 6 by scraper 71, it is possible to efficiently store the tapes 33 and 34 after cutting in waste box 6 and the processing frequency of the tapes 33 and 34 can be reduced further. Also, because tapes 33 and 34 which have been automatically scraped out of waste box 6 can be automatically collected in collection box 81, time consuming work of collecting tapes 33 and 34 by an operator can be omitted.

Also, because tape collection device 8 can be automatically moved between multiple component mounters 1 which make up a manufacturing line, the efficiency of collecting tapes 33 and 34 can be improved. Also, because ejection door 61 of waste box 6 and collection doors 83 of collection box 81 are opened in conjunction with the movement in which tapes 33 and 34 are scraped out of waste box 6, a device or the like to open and close each door 61 and 83 is not required and this can reduce the device cost.

Further, in the embodiment described above, the configuration was such that the component picking quantity is used to judge that tapes 33 and 34 are indexed to a predetermined length in housing 56 of tape cutting device 5, however, it is also acceptable to judge by a sensor or the like which can measure the tape index amount or tape length at feeder 31. Also, the configuration was such that storage sensor 62 detects that tapes 33 and 34 are accumulated to a predetermined amount in waste box 6 directly under the tape cutting position in waste box 6, however, it is also acceptable to judge by the cutting count of tape cutting device 5.

Also, the configuration was such that the tape moving count of scraper 71 was used to judge that waste box 6 is filled with tapes 33 and 34, it is also acceptable to judge based on the index amount of scraper 71 being gradually reduced and reaching a predetermined value. Also, the configuration was such that collection sensor 91 detects that collection box 81 is filled with tapes 33 and 34, however, it is also acceptable to judge by the collection count by scraper 71.

INDUSTRIAL APPLICABILITY

A component mounter of the present disclosure can be applied when tape in which components are stored is processed.

REFERENCE NUMBER LIST

1: Component mounter
2: Board conveyance device
3: Component supply device
4: Component picking device
5: Tape cutting device
6: Waste box
7: Tape scraping out device
8: Tape collection device
9: Control device
33: Cover tape
34: Carrier tape
51: Cutter
61: Ejection door
62: Storage sensor
71: Scraper
72: Scraper moving device
81: Collection box
82: Collection box moving device
83: Collection door
91: Collection sensor

The invention claimed is:

1. A component mounter which picks components which are stored in tape and supplied from a component supply device by a component picking device and mounts components on a board which is conveyed by a board conveyance device, comprising:
a waste box which stores the cut tape after the components are picked, a side of the waste box including an ejection door,
a storage sensor that detects an amount of the cut tape in the waste box,
a scraping out device which scrapes the tape out of the waste box,
a collection device which collects the tape which is scraped out by the scraping out device, the collection device including a collection door configured to open by contact with the ejection door, and
a control device which controls scraping out the stored tape by the scraping out device when the tape is stored in the waste box to a predetermined amount as detected by the storage sensor.

2. The component mounter according to claim 1, wherein the scraping out device is movable in the waste box and comprises a scraper which can scrape the tape stored in the waste box out of the waste box and a moving device which moves the scraper.

3. The component mounter according to claim 1, wherein the control device is configured to control the collection of the tape which is scraped out of the waste box into the collection device by opening the ejection door by the pushing force of the tape scraped out by the scraping out device and by opening the collection door by the pushing force of the ejection door which is opened.

4. The component mounter according to claim 1, wherein a rotation axis of the ejection door is substantially orthogonal to a rotation axis of the collection door.

* * * * *